United States Patent
Cotte et al.

(10) Patent No.: US 10,308,506 B2
(45) Date of Patent: Jun. 4, 2019

(54) USE OF A REACTIVE, OR REDUCING GAS AS A METHOD TO INCREASE CONTACT LIFETIME IN MICRO CONTACT MEMS SWITCH DEVICES

(71) Applicant: International Business Machines Corporation, Armonk, NY (US)

(72) Inventors: John M. Cotte, Armonk, NY (US); Nils D. Hoivik, Armonk, NY (US); Christopher V. Jahnes, Armonk, NY (US)

(73) Assignee: International Business Machines Corporation, Armonk, NY (US)

(*) Notice: Subject to any disclaimer, the term of this patent is extended or adjusted under 35 U.S.C. 154(b) by 81 days.

(21) Appl. No.: 15/008,135

(22) Filed: Jan. 27, 2016

(65) Prior Publication Data

US 2017/0210620 A1    Jul. 27, 2017

(51) Int. Cl.
*H01L 23/20*     (2006.01)
*B81C 1/00*      (2006.01)
*H01H 59/00*     (2006.01)
*B81B 7/00*      (2006.01)

(52) U.S. Cl.
CPC ........ *B81C 1/00285* (2013.01); *B81B 7/0038* (2013.01); *H01H 59/0009* (2013.01); *B81B 2201/014* (2013.01)

(58) Field of Classification Search
CPC ............. B81B 7/0038; H01H 59/0009; B81C 1/00285; H01L 29/66363; H01L 29/74; H01L 2924/1301; H01L 27/0262; H01L 29/7393; H01L 31/1113; H01L 29/84; H01L 23/20; H01L 23/26; H01L 23/564

USPC ....... 257/682, 107, 130, 155, 608, 416, 245, 257/254

See application file for complete search history.

(56) References Cited

U.S. PATENT DOCUMENTS

| 4,348,566 A | 9/1982 | Baba et al. |
|---|---|---|
| 7,071,432 B2 | 7/2006 | Lindsey, et al. |
| 9,637,511 B2 * | 5/2017 | Youn ................. C07F 15/045 |

(Continued)

FOREIGN PATENT DOCUMENTS

| CH | 351337 A | 1/1961 |
|---|---|---|
| DE | 1020735 B | 12/1957 |

(Continued)

*Primary Examiner* — Kimberly N Rizkallah
*Assistant Examiner* — Dilinh P Nguyen
(74) *Attorney, Agent, or Firm* — The Law Offices of Robert J. Eichelburg

(57) ABSTRACT

A MEMS device comprises an electro mechanical element in a sealed chamber containing a gas comprising a reactive gas selected to react with any contaminants that may be present or formed on the operating surfaces of the device in a manner to maximize the electrical conductivity of the surfaces during operation of the device. The MEMS device may comprise a MEMS switch having electrical contacts as the operating surfaces. The reactive gas may comprise hydrogen or an azane, optionally mixed with an inert gas, or any combination of the gases. The corresponding process provides a means to substantially reduce or eliminate contaminants present or formed on the operating surfaces of MEMS devices in a manner to maximize the electrical conductivity of the surfaces during operation of the devices.

5 Claims, 1 Drawing Sheet

(56) References Cited

U.S. PATENT DOCUMENTS

| | | | |
|---|---|---|---|
| 2003/0089394 A1* | 5/2003 | Chang-Chien | B81B 7/0038 137/14 |
| 2006/0127304 A1* | 6/2006 | Fujii | B01J 20/04 423/644 |
| 2009/0115565 A1 | 5/2009 | Watanabe et al. | |
| 2012/0307215 A1* | 12/2012 | Sano | G02B 26/0808 355/30 |
| 2014/0246740 A1* | 9/2014 | Van Den Hoek | B81C 1/00285 257/419 |

FOREIGN PATENT DOCUMENTS

| | | |
|---|---|---|
| GB | 1032722 A | 6/1966 |
| GB | 1399014 | 6/1975 |
| JP | 05174660 A | 7/1993 |
| JP | 2007157430 A | 6/2007 |
| JP | 5516994 B2 | 6/2014 |
| WO | WO2008110389 A1 | 9/2008 |

* cited by examiner

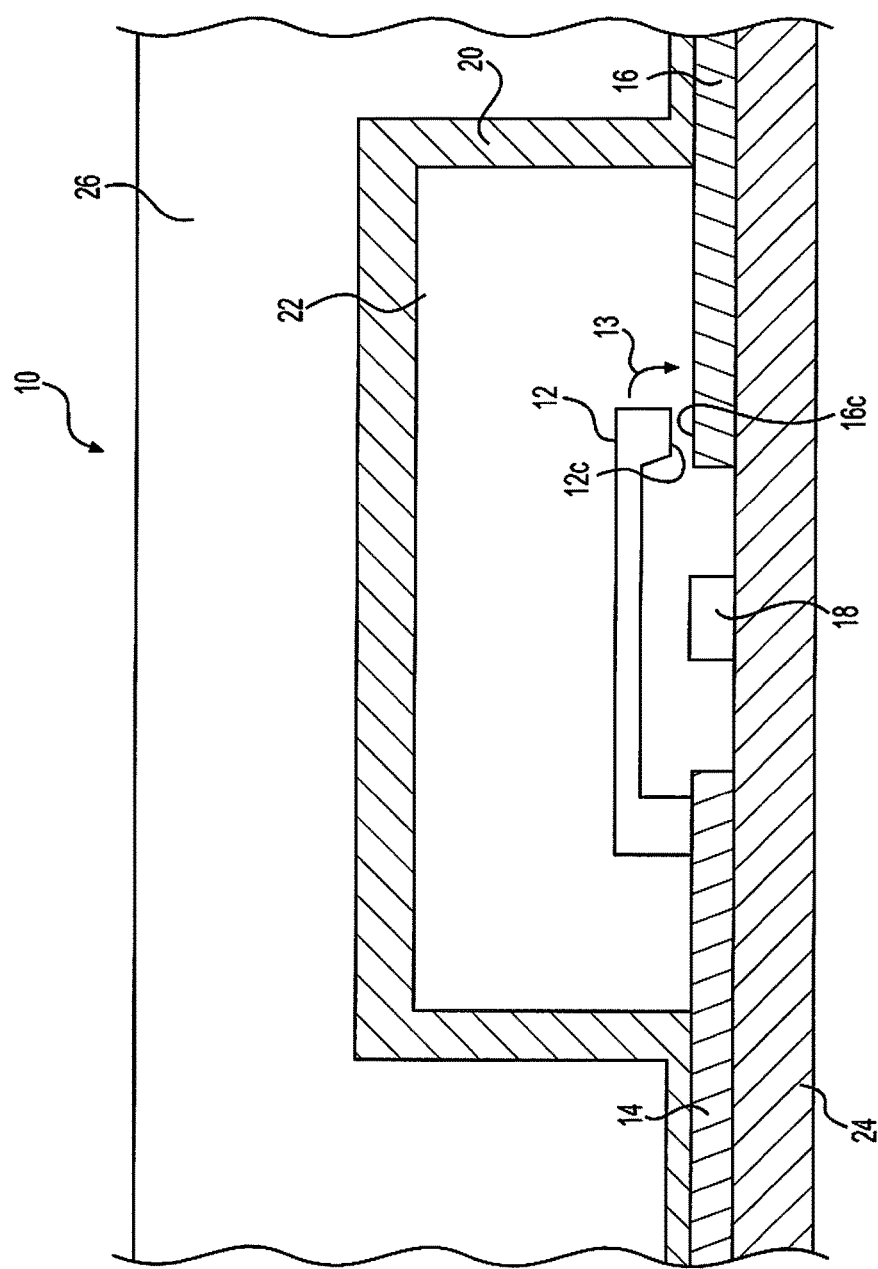

USE OF A REACTIVE, OR REDUCING GAS AS A METHOD TO INCREASE CONTACT LIFETIME IN MICRO CONTACT MEMS SWITCH DEVICES

FIELD OF THE INVENTION

The present invention relates to micro-electro-mechanical system (MEMS) devices, such as MEMS switches, and in particular to controlling actuation of MEMS switches to improve performance.

BACKGROUND OF THE INVENTION

The "silicon revolution" drove the development of faster and larger computers beginning in the early 1960's giving rise to predictions of rapid growth because of the increasing numbers of transistors packed into integrated circuits with estimates they would double every two years. ("Moore's Law") Since 1975, however, they doubled about every 18 months.

An active period of innovation in the 1970's followed in the areas of circuit design, chip architecture, design aids, processes, tools, testing, manufacturing architecture, and manufacturing discipline. The combination of these disciplines brought about the VLSI era and the ability to mass-produce chips with 100,000 transistors per chip at the end of the 1980's, succeeding the large scale Integration ("LSI") era of the 1970's with only 1,000 transistors per chip. (Carre, H. et al. "Semiconductor Manufacturing Technology at IBM", *IBM J. RES. DEVELOP.*, VOL. 26, no. 5, September 1982). Mescia et al. also describe the industrial scale manufacture of these VLSI devices. (Mescia, N.C. et al. "Plant Automation in a Structured Distributed System Environment," *IBM J. RES. DEVELOP.*, VOL. 26, no. 4, (July 1982).

The release of IBM's Power6™ chip in 2007, noted "miniaturization has allowed chipmakers to make chips faster by cramming more transistors on a single slice of silicon, to the point where high-end processors have hundreds of millions of transistors. . . . " (http://www.nytimes.com/reuters/technology/tech-ibm-power.html?pagewanted=print (2/7/2006))

More recently, "engineers did a rough calculation of what would happen had a 1971 Volkswagen Beetle improved at the same rate as microchips did under Moore's Law: 'Here are the numbers: [Today] you would be able to go with that car 300,000 miles per hour. You would get two million miles per gallon of gas, and all that for the mere cost of 4 cents!'" T. Friedman, N.Y. Times, Op Ed, May 13, 2015.

Technology scaling of semiconductor devices to 90 nm and below has provided many benefits in the field of microelectronics, but has introduced new considerations as well. Smaller chip geometries result in higher levels of on-chip integration and performance, higher current and power densities, increased leakage currents, and low-k dielectrics all of which present new challenges to package designs.

Components fabricated with microelectromechanical systems (MEMS) are being incorporated in an increasing number of consumer applications including, but not limited to, automotive electronics, medical equipment, cell phones, hard disk drives, computer peripherals, and wireless devices. MEMS technology is directed at forming miniaturized electro-mechanical devices and structures using micro-fabrication techniques. MEMS devices are characterized by some form of mechanical functionality, which is typically in the form of a least one moving structure. Structures may be formed on a suitable substrate by a series of processing steps involving thin film depositions that are photolithographically masked and etched. MEMS mechanical elements, sensors, and actuators may be integrated on a common substrate with complementary metal-oxide-semiconductor (CMOS) devices.

Fabricators manufacture MEMS devices using processes and equipment developed for standard semiconductor integrated circuit chips, which allowed for microfabrication with increased precision, smaller devices, and generally devices having lower power requirements. One type of MEMS device that has wide applicability in the electronics industry comprises the MEMS switch which evolved from the increased need for miniature switches on semiconductor substrates along with other semiconductor components to form various types of circuits.

These miniature switches can act as relays and in many instances replaced field effect transistor switches (FETS) in microcircuits. Manufacturers employed MEMS switches to reduce insertion losses due to added resistance as well as parasitic capacitance and inductance inherent in FETS in a signal path. MEMS switches also find use in many radio frequency (RF) applications, such as antenna switches, load switches, transmit or receive switches, tuning switches, and the like. Some applications utilize multiple MEMS switches, with each having specific electrical requirements, mechanical requirements, or both. These applications require consistency of electrical characteristics or mechanical characteristics, or both.

MEMS switches rely on mechanical movement of a deflection electrode to make or break contact with a stationary electrode, thus forming a short circuit or an open circuit depending on the position of the deflection electrode. MEMS switches are typically actuated by using electrostatic forces to produce the mechanical movement required to change the state of the switch. MEMS switches are noted for their low power consumption, high isolation in the off state, low insertion loss in the on state, and high linearity, typically outperforming switches relying on semiconductor devices such as field-effect transistors (FETs). Switches provide an important building block in many electronic systems, and the performance characteristics of MEMS switches make them particularly attractive for providing signal switching functions in mixed signal, communications, and radio frequency integrated circuit applications.

One of the devices comprise MEMS-based relays for application in radio frequency ("RF") communication technologies because the switching characteristics of a MEMS relay is superior to those of traditional switches like the GaAs MESFET, and the p-i-n diode. For example, MEMS relays have lower power consumption rates, lower insertion losses, and higher linearity. All these features make MEMS relays a great candidate for wireless communication applications like wireless transceivers in cellular phones.

MEMS switches require large voltages to actuate the switch. Fabricators term this as a "pull-down," or "pull-in," or actuation voltage, which is anywhere from 20 to 40 volts or more. A typical MEMS switch uses electrostatic force to cause mechanical movement that result in electrically bridging a gap between two contacts such as in the bending of a cantilever. In general this gap is relatively large in order to achieve large impedance during the "off" state of the MEMS switch. Consequently, this large pull-down voltage electrically bridges the large gap, while a smaller maintaining voltage maintains the bridge. These high pull-down voltages can cause arcing and consequent oxidation in the switch which contributes to its eventual breakdown. Even so, a typical MEMS switch has a useful life of approximately $10^8$ to $10^9$ cycles, but fabricators nonetheless have an interest in increasing the lifetime of these switches.

MEMS microswitches, including those with very low contact forces, are also very sensitive to any organic or other contamination occurring on the contact surfaces. Therefore, these switches are typically packaged or sealed as early as possible in the manufacturing process in an inert ambient environment. This environment is typically a mixture of inert gases such as $N_2$, Ar and the like, where the pressure vary between atmospheric pressure and higher. For larger switches, such as relays, getters are commonly used within the package to accumulate any contamination which may arise in the package. This method works very well for larger packages, but for micro-scale switches such as MEMS switches, including a getter within the package may be very challenging if not impossible for small cavities created in fabricating the switches. Therefore, a clean environment consisting of an inert gas such is typically employed in the small cavity.

RELATED ART

The following references relate to the state of the art in the field of MEMS device manufacturing, including MEMS switches: WO2008110389A1; U.S. xxx2,0090115565; U.S. Pat. No. 4,348,566; JP5516994B2; JP05174660A; GB1399014; GB1032722A; CH351337A; and DE1020735B.

SUMMARY OF THE INVENTION

Not only do the written description, claims, drawing, and abstract of the disclosure set forth various features, objectives, and advantages of the invention and how they may be realized and obtained, but these features, objectives, and advantages will also become apparent by practicing the present invention. This comprises structures, articles of manufacture, processes, and products produced by these processes that address the forgoing needs to not only provide advantages over the related art, but also substantially obviate one or more of the foregoing and other limitations and disadvantages of the related art. We do this with our invention which comprises a MEMS device such as a MEMS switch incorporating a reactive or reducing gas that will react with any possible organic or other contamination accumulating or occurring on the surface of the micro-contacts of the switch during activation to increase contact lifetime of these micro-contacts in the MEMS switch devices.

BRIEF DESCRIPTION OF THE DRAWING

The accompanying drawing is not necessarily drawn to scale but nonetheless sets out the invention, and is included to illustrate various embodiments of the invention, and together with this specification also serves to explain the principles of the invention. The drawing comprises a FIGURE illustrating a side elevation in cross-section of one type of a MEMS device of the invention, e.g., a MEMS switch.

DETAILED DESCRIPTION OF THE INVENTION

To achieve the foregoing and other advantages, and in accordance with the purpose of this invention as embodied and broadly described herein, the following detailed description comprises examples of the invention that can be embodied in various forms. The specific processes, compounds, compositions, and structural details set out herein not only comprise a basis for the claims and a basis for teaching one skilled in the art how to employ the present invention in any novel and useful way, but also provide a description of how to make and use this invention. The written description claims, drawing, and abstract of the disclosure that follow set forth various features, objectives, and advantages of the invention and how they may be realized and obtained. Again, these features, objectives, and advantages will also become apparent by practicing the invention.

MEMS switches with very low contact forces are very sensitive to any organic or other contamination occurring on the contact surfaces. High contact forces reported for MEMS switches are typically in the mN region (i.e ~50 mN for the OMRON switch), whereas a normal contact force may be considered in the 10-hundreds of micro-Newton range. Very low contact force may be considered at ~1 uN and lower. J. Oberhammer and G Stemme, *Active Opening Force and Passive Contact Force Electrostatic Switches for Soft Metal Contact Materials*, JMEMS, Vol. 15 No. 5, October 2006, describe this and report findings in Table 1. For the purpose of the present invention, we may employ contact forces in a range <100 uN. Therefore, these switches are typically packaged or sealed as early as possible in the manufacturing process in an inert ambient environment. This environment is typically a mixture of inert gases such as $N_2$, Ar and the like and the pressure vary between atmospheric pressure and higher. For larger switches, such as relays, getters are commonly used within the package to accumulate any contamination which may arise in the package. This method works very well for larger packages, but for micro-scale MEMS devices or switches, including a getter within the package may be very challenging, if not impossible for small cavities created during fabrication of switches. Therefore, a clean environment with an inert gas is typically employed within the small cavity.

The invention comprises, inter alia, an article of manufacture and a process for overcoming these and other related art difficulties by using a reactive or reducing gas that will react with any possible organic or other contamination accumulating or occurring on the surface of the moving parts of a MEMS device such as micro-contacts of a MEMS switch. By using a reactive or reducing gas within the package of a sealed micro-switch the lifetime of the contact surfaces may be increased. The reactive or reducing gas will react with any organic or inorganic contamination accumulating or forming on the contact surfaces which may compromise the switch lifetime or performance. This approach is different from using a getter placed strategically in the device package, but not on the contact surfaces of the moving parts of a MEMS such as the contact points in a MEMS switch. The reactive or reducing gas, however, will react with any possible contaminant on, or forming on the contact surfaces of a MEMS device such as a MEMS switch. During sealing, or packaging of the MEMS device, rather than using only an inert gas to remain in the cavity or package, the invention comprises introducing a reactive or reducing gas into and then sealing it in the cavity or package of a MEMS device.

The reactive or reducing gas comprises a gas that will react with contaminants ordinarily found in MEMS devices such as MEMS switches. These contaminants may comprise organic or other residues, e.g., inorganic residues that may remain in the device after manufacturing or that are generated during use of the device. In one embodiment of the invention these gases comprise inorganic reactive gases or reducing gases. The organic contaminants residues remnant from the MEMS fabrication process, comprise for example, photoresists or solvents, or atmospheric sources. Inorganic residues or contaminants can be oxides formed on the switch contact surfaces during use of the MEMS device.

The reactive or reducing gas in one embodiment comprises an inorganic gas, i.e., a gas that does not contain carbon. In a further embodiment the reactive or reducing gas comprises compounds or compositions of matter that maybe gaseous over a range of temperatures such as room temperature (20° C.) or below up to the manufacturing temperature of the MEMS device or up to the temperature developed within the MEMS device when in use and slightly higher, e.g., any where from about 2° C. to about 20° C. higher than the operating temperature of the MEMS device.

In a further embodiment these reducing gases may comprise inorganic gases, e.g., hydrogen and nitrogen hydrides also referred to as azanes which include, inter alia, a homologous series of inorganic compounds with the general chemical formula $N_nH_{n+2}$, where n=1~7. In one embodiment we employ azanes, e.g., azanes which are not the explosive azanes known in the art. Some members of the azanes in this regard (in terms of number of nitrogen atoms) comprise ammonia, $NH_3$; diazane (or hydrazine), $N_2H_4$; triazane, $N_3H_5$; tetrazane or tetraazane, $N_4H_6$; pentazane or pentaazane, $N_5H_7$; hexazane or hexaazane, $N_6H_8$; heptazane or heptaazane, $N_7H_9$; and the like, especially those that conform to the foregoing criteria. In another embodiment, we select the reactive gas so that the reactive process taking place at the contact surfaces may not leave any residual material or any substantial amount of residual material at the contact surfaces which again may cause contamination. In a further embodiment we select the reactive gas so that if the byproduct/residue from the reduction process has a charge, it may be concentrated in the region where the electrostatic field in the switch is the greatest (the activator 18 illustrated in the FIGURE, i.e., drawing and by this approach ensure that the residue is not accumulated near the contact surface, which typically does not have a charge across it.

Because of the flammable nature of hydrogen and of some of the other reactive gases, in one embodiment we from a mixture of an inert gas such as nitrogen or a noble gas with the reactive gas in an amount to reduce the flammability either in manufacturing the MEMS device or use of the MEMS device. We also employ the inert gas to control the reaction rate of the reactive gas, especially the reactive gas in the sealed chamber, and any exotherm that may result from reaction of the reactive gas, especially any exotherm that may result from reaction of the reactive gas with any contaminants. The noble gases include the Group VIIIA gases of the Periodic Table of the Elements, e.g., He, Ne, Ar, Kr, and Xe. Although falling within the Group VIIIA gases, we do not include Rn as one of the enumerated noble gases because of its radioactivity. The inert gas can be mixed with the reactive gases where the mixture of inert gas and reactive gas may comprise mixtures of from trace amounts up to about 90 mol percent of one gas and the balance, the other gas, where the trace amount may be about 500 ppm on a molar basis. The inert gas or can also be mixed with the reactive gas where the mixture of inert gas and reactive gas may comprise mixtures of from about one mol percent up to about 90 mol percent of one gas and the balance the other gas.

Lastly, we may also employ combinations of reactive gases and combinations of optional inert gases, such as the two component, three component or four component combinations or more of each of these gases.

The FIGURE illustrates a side elevation in cross-section of a MEMS switching device 10 in an open position comprising an electrically conductive flexible switching arm 12 movable toward electrical conductor 16 in the direction shown by arrow 13. Arm 12 connects to electrical conductor 14 to provide electrical current through the circuit formed by arm 12 and electrical conductors 14 and 16 when arm 12 is brought into contact with conductor 16 by means of activator 18. Arm 12 in this regard is moveable in the direction of arrow 13 by means of an electrostatic force provided by activator 18 to develop a "pull-down," or "pull-in," or actuation voltage anywhere from about 20 to about 40 volts or more. The electrostatic force causes mechanical movement in flexible switching arm 12 in the direction of arrow 13 that results in closing the gap between the operating surface or contact surface 12C on the end of flexible switching arm 12 and the operating surface or contact surface 16C on electrical conductor 16 so that surface 12C is in electrical contact with surface 16C when the MEMS switching device 10 is in the "on" position. Opening and closing the gap between the surfaces 12C and 16C causes electrical arcing between them that in turn causes a reaction of any organic or inorganic materials in the device 10 that produce contaminant reaction products that deposit on the surfaces and impedes electrical conductivity between them. The reactive gas or reducing gas combines with or reacts with the contaminant reaction products substantially removing them from the surfaces or otherwise substantially maximizing the electrical conductivity of the surfaces.

Housing 20 encloses switching arm 12, electrical conductor 14, and electrical conductor 16, providing a chamber 22 that contains the reactive or reducing gas. Again, this reactive or reducing gas substantially maximizes electrical conductivity, i.e., substantially restores or substantially reverses lost electrical conductivity of the contact surface 12C and/or the contact surface 16C during day-to-day operation of MEMS switching device 10 and over the lifetime of operation of MEMS switching device 10. Substrate 24 supports the foregoing elements. In one embodiment, substrate 24 may comprise a semiconductor structure known in the art with conductors 14 and 16 operatively associated with it, e.g., electrically connected to it. Overmold 26 envelops the device 10.

Various embodiments of our invention also comprise inter alia an article of manufacture comprising a MEMS device that comprises a sealed chamber containing an electro mechanical element having operating surfaces, the sealed chamber containing a reactive gas comprising a reducing gas selected to react with any contaminants on the operating surfaces of the MEMS device in the sealed chamber in a manner to maximize the electrical conductivity of the operating surfaces during operation of the MEMS device; the reactive gas comprises hydrogen or an azane or combinations thereof; the azane reactive gas comprises a non-explosive azane selected from a homologous series of inorganic compounds with the general chemical formula $N_nH_{n+2}$, where n=1~7 or combinations thereof. In addition:

b. the reactive gas may be optionally mixed with an inert gas to control the reactivity of the reactive gas.

Related art describes the manufacture MEMS devices, as for example U.S. Pat. Nos. 7,735,216; 7,710,059; 7,616,889; 7,427,846; 7,336,900; 6,429,755; 6,391,674; 6,275,122; and 6,238,946. Related art also describes MEMS switches and methods for their manufacture in U.S. Pat. Nos. 9,019,049; 8,829,626; 8,791,778; 8,748,207; 8,609,450; 8,604,898;

8,451,077; 8,445,306; 8,211,728; 7,726,010; 17,657,995; 7,602,265; 7,581,314; 7,348,870; 7,202,764; and 6,744,338. U.S. Pat. No. 7,999,643 describes MEMS switches that incorporate gases in their interiors and methods for their manufacture. We can manufacture the MEMS devices or MEMS switches of the invention in accord with any one or combination of the foregoing disclosures, e.g., the foregoing disclosures in the public realm.

Throughout this specification, and abstract of the disclosure, the inventors have set out equivalents, of various materials as well as combinations of elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter or the meaning ordinarily ascribed to these terms by a person with ordinary skill in the art. In another embodiment, the terms "about," "substantial," or "substantially," when employed to define numerical parameter include, e.g., a variation up to five percent, ten percent, or 15 percent, or somewhat higher. Applicants intend that terms used in the as filed or amended written description and claims of this application that are in the plural or singular shall also be construed to include both the singular and plural respectively when construing the scope of the present invention.

All scientific journal articles and other articles, including internet sites, Information Disclosure Statements as well as issued and pending patents that this written description or applicants' Invention Disclosure Statements mention, including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the references cited therein, as all or any one may bear on or apply in whole or in part, not only to the foregoing written description, but also the following claims, drawing, and abstract of the disclosure.

Although we describe the invention by reference to some embodiments, other embodiments defined by the doctrine of equivalents are intended to be included as falling within the broad scope and spirit of the foregoing written description, and the following claims, abstract of the disclosure, and drawing.

We claim:

1. An article of manufacture comprising a MEMS device that comprises a sealed chamber containing an electro mechanical element having operating surfaces, said sealed chamber containing a reactive gas comprising a reducing gas selected to react with any contaminants on said operating surfaces of said MEMS device in said sealed chamber in a manner to maximize the electrical conductivity of said operating surfaces during operation of said MEMS device;
said reactive gas comprises hydrogen or an azane or combinations thereof;
said azane reactive gas comprises a non-explosive azane selected from a homologous series of inorganic compounds with the general chemical formula $N_nH_{n+2}$, where $n=1\sim7$ or combinations thereof.

2. An article of manufacture comprising a MEMS device that comprises a sealed chamber containing an electro mechanical element having operating surfaces, said sealed chamber containing a reactive gas comprising a reducing gas selected to react with any contaminants on said operating surfaces of said MEMS device in said sealed chamber in a manner to maximize the electrical conductivity of said operating surfaces during operation of said MEMS device;
wherein said MEMS device comprises a MEMS switch and said operating surfaces comprise electrically conductive switch contact surface;
wherein said reactive gas comprises hydrogen or an azane or combinations thereof;
and wherein said azane reactive gas comprises a non-explosive azane selected from a homologous series of inorganic compounds with the general chemical formula $N_nH_{n+2}$, where $n=1\sim7$ or combinations thereof.

3. The article of manufacture of claim 2 wherein said reactive gas is optionally mixed with an inert gas to control the reactivity of said reactive gas.

4. An article of manufacture comprising a MEMS device that comprises a sealed chamber containing an electro mechanical element having operating surfaces, said sealed chamber containing a reactive gas comprising a reducing gas selected to react with any contaminants on said operating surfaces of said MEMS device in said sealed chamber in a manner to maximize the electrical conductivity of said operating surfaces during operation of said MEMS device;
said reactive gas comprises hydrogen or an azane or combinations thereof;
said azane reactive gas comprises a non-explosive azane selected from a homologous series of inorganic compounds with the general chemical formula $N_nH_{n+2}$, where $n=1\sim7$ or combinations thereof;
and said reactive gas is optionally mixed with an inert gas to control the reactivity of said reactive gas.

5. An article of manufacture comprising a MEMS device that comprises a sealed chamber containing an electro mechanical element having operating surfaces, said sealed chamber containing a reactive gas comprising a reducing gas selected to react with any contaminants on said operating surfaces of said MEMS device in said sealed chamber in a manner to maximize the electrical conductivity of said operating surfaces during operation of said MEMS device;
wherein said reactive gas comprises hydrogen or an azane or combinations thereof;
wherein said azane reactive gas comprises a non-explosive azane selected from a homologous series of inorganic compounds with the general chemical formula $N_nH_{n+2}$, where $n=1\sim7$ combinations thereof;
and said reactive gas is optionally mixed with an inert gas to control the reactivity of said reactive gas, wherein said inert gas is selected from nitrogen or a noble gas and combinations thereof.

* * * * *